(12) United States Patent
Li

(10) Patent No.: US 10,297,623 B2
(45) Date of Patent: May 21, 2019

(54) TFT SUBSTRATE MANUFACTURING METHOD

(71) Applicant: Shenzhen China Star Optoelectronics Technology Co., Ltd., Shenzhen (CN)

(72) Inventor: Ji Li, Shenzhen (CN)

(73) Assignee: SHENZHEN CHINA STAR OPTOELECTRONICS TECHNOLOGY CO., LTD., Shenzhen, Guandong (CN)

( * ) Notice: Subject to any disclaimer, the term of this patent is extended or adjusted under 35 U.S.C. 154(b) by 0 days.

(21) Appl. No.: 15/556,620

(22) PCT Filed: Jun. 20, 2017

(86) PCT No.: PCT/CN2017/089263
§ 371 (c)(1),
(2) Date: Sep. 8, 2017

(87) PCT Pub. No.: WO2018/214203
PCT Pub. Date: Nov. 29, 2018

(65) Prior Publication Data
US 2018/0342541 A1    Nov. 29, 2018

(30) Foreign Application Priority Data

May 23, 2017    (CN) .......................... 2017 1 0370203

(51) Int. Cl.
*H01L 21/00*    (2006.01)
*H01L 27/12*    (2006.01)
(Continued)

(52) U.S. Cl.
CPC ........ *H01L 27/1288* (2013.01); *G03F 7/0045* (2013.01); *G03F 7/16* (2013.01);
(Continued)

(58) Field of Classification Search
CPC ............... H01L 27/1288; H01L 27/127; H01L 21/0274; G03F 7/168; G03F 7/2004;
(Continued)

(56) References Cited

U.S. PATENT DOCUMENTS 6,162,725 A * 12/2000 Tanaka ...................... H01J 9/02
438/609
8,390,776 B2 * 3/2013 Jeong .................. H01L 27/1214
349/187

FOREIGN PATENT DOCUMENTS

| CN | 101373343 A | 2/2009 |
| CN | 101630640 A | 1/2010 |
| CN | 105914183 A | 8/2016 |

* cited by examiner

*Primary Examiner* — Vu A Vu
(74) *Attorney, Agent, or Firm* — Leong C. Lei

(57) ABSTRACT

The present invention provides a TFT substrate manufacturing method. The method uses a photoresist material that contains crystallizable and precipitatable pigment to form a photoresist layer, so that a plurality of crystallization burrs can be formed on a surface of the photoresist layer, making it possible for a pixel electrode film not completely covering the surface of the photoresist layer and thus, allowing a peeling agent to pass through the crystallization burrs and penetrate into the photoresist layer to cause corrosion of the photoresist layer thereby peeling off the photoresist layer and a portion of the pixel electrode film located on the photoresist layer at the same time to form a pixel electrode, whereby, compared to the prior art, peeling can be conducted without adopting a special mask and involving special mask parameters and also requiring no plasma treatment so that the process of fabricating a TFT substrate can be simplified to enhance fabrication efficiency of the TFT substrate.

16 Claims, 8 Drawing Sheets

(51) Int. Cl.
*G03F 7/004* (2006.01)
*G03F 7/16* (2006.01)
*G03F 7/20* (2006.01)
*G03F 7/30* (2006.01)
*G03F 7/40* (2006.01)
*H01L 21/027* (2006.01)

(52) U.S. Cl.
CPC ............ *G03F 7/168* (2013.01); *G03F 7/2004* (2013.01); *G03F 7/2024* (2013.01); *G03F 7/30* (2013.01); *G03F 7/40* (2013.01); *H01L 21/0274* (2013.01); *H01L 27/127* (2013.01)

(58) Field of Classification Search
CPC ........ G03F 7/2024; G03F 7/0045; G03F 7/30; G03F 7/16; G03F 7/40
USPC .......................................................... 438/155
See application file for complete search history.

TFT SUBSTRATE MANUFACTURING METHOD

BACKGROUND OF THE INVENTION

1. Field of the Invention

The present invention relates to the field of display technology, and more particular to a thin-film transistor (TFT) substrate manufacturing method.

2. The Related Arts

With the progress of the display technology, flat panel display devices, such as liquid crystal display (LCD), due to various advantages, such as high image quality, low power consumption, thin device body, and wide range of applications, have been widely used in various consumer electronic products, including mobile phones, televisions, personal digital assistants, digital cameras, notebook computers, and desktop computers, making them the main stream of display devices.

A liquid crystal display panel is generally made up of a color filter (CF) substrate, a thin film transistor (TFT) substrate, liquid crystal (LC) interposed between the CF substrate and the TFT substrate, and sealant and is generally manufactured with a process involving an anterior stage of array engineering (involving thin film, photolithography, etching, and film peeling), an intermediate stage of cell engineering (involving lamination of the array substrate and the CF substrate), and a posterior stage of module assembly (involving combining a drive integrated circuit (IC) and a printed circuit board). Among these stages, the anterior stage of array engineering generally involves the formation the array substrate for controlling the movement of liquid crystal molecules; the intermediate stage of cell engineering generally involves filling liquid crystal between the array substrate and the CF substrate; and the posterior stage of module assembly generally involves the combination of the drive IC and the printed circuit board for driving the liquid crystal molecules to rotate for displaying images.

Contemporary methods for manufacturing TFT substrates have evolved from the early 7 mask based techniques to 4 mask based techniques. The four masks are respectively used in formation of a patterned gate terminal, patterned active layer and source/drain terminals, a via in a pixel electrode, and a patterned pixel electrode. Concurrent with this, 3 mask based techniques have been started using in some products for further simplifying the manufacturing operations of TFT substrates, shortening manufacturing time, and increasing manufacturing efficiency. A process that adopts 3 mask based techniques to manufacture a TFT substrate generally includes: applying a first mask process to make a patterned gate electrode on a backing plate, covering the gate electrode and the backing plate with a gate insulation layer, applying a second mask process to simultaneously make a patterned active layer and source and drain electrodes, covering the active layer and the source and drain electrodes with a passivation layer, applying a third mask process to make a pixel electrode via and a patterned photoresist layer, coating a pixel electrode material on the photoresist layer and the passivation layer, and applying lift-off technology to peel off the photoresist layer and the pixel electrode material that is located on the photoresist layer to form a patterned pixel electrode, wherein the second mask and the third mask are each a gray tone mask (GTM) or a half tone mask (HTM).

The lift-off technology is a key factor that the 4 mask based technique may evolve into 3 mask based technique. The lift-off technology is a technique that allows photoresist and a film deposited on the photoresist to be peeled off without breaking or damaging a film pattern formed on a substrate. Specifically, the 3 mask based technique is one that allow the photoresist and the pixel electrode film located on the photoresist to be peeled off together with a patterned pixel electrode preserved. Currently, there are two methods that can realize such an operation of simultaneously peeling off photoresist and the pixel electrode film located on the photoresist. The first one involves the use of a special gray tone mask or half tone mask, in combination with special photolithographic parameters, to cause undercutting of photoresist in some areas so that a peeling agent may cause the photoresist and the pixel electrode film located on the photoresist to peel from the undercut portion. The second one involves, after a photoresist layer is formed but before a pixel electrode film is formed, subjecting a surface of the photoresist layer to devoted plasma treatment to make the surface of the photoresist layer become a corrugated irregular film surface so that a peeling agent may cause the photoresist and the pixel electrode film located on the photoresist to peel from the corrugated irregular film surface. In the above two methods, the first method requires using a special gray tone mask or half tone mask as well as special photolithographic parameters, and the second method requires subjecting the surface of the photoresist layer to devoted plasma treatment, both involving complicated processes, resulting in extended production time and low manufacturing efficiency.

SUMMARY OF THE INVENTION

An objective of the present invention is to provide a thin film transistor (TFT) substrate manufacturing method, which helps simplify the process for manufacturing a TFT substrate and increases fabrication efficiency of the TFT substrate.

To achieve the above objective, the present invention provides a TFT substrate manufacturing method, which comprises the following steps:

Step S1: providing a backing plate, forming a TFT layer on the backing plate through operations involving a first mask and a second mask, and covering the TFT layer with a passivation layer;

Step S2: forming a photoresist layer and a pixel electrode via through an operation involving a third mask, wherein the photoresist layer is made of a material comprising a crystallizable and precipitatable pigment; the photoresist layer is formed on the passivation layer; the photoresist layer comprises a pattern that corresponds to a pattern of a pixel electrode to be formed, and the photoresist layer has a surface on which a plurality of crystallization burrs are formed; and the pixel electrode via extends through the passivation layer to expose a portion of the TFT layer;

Step S3: forming a pixel electrode film on the passivation layer, the photoresist layer, and the pixel electrode via; and Step S4: applying a peeling agent to corrode the photoresist layer so as to peel off the photoresist layer and a portion of the pixel electrode film located on the photoresist layer to form a pixel electrode.

Step S1 specifically comprises:

Step S11: providing a backing plate, forming a first metal layer on the backing plate, and patterning the first metal layer with the first mask to form a gate electrode;

Step S12: covering the gate electrode and the backing plate with a gate insulation layer;

Step S13: forming a semiconductor layer and a second metal layer, which are in a stacked arrangement, on the gate insulation layer;

Step S14: coating photoresist on the second metal layer and patterning the photoresist with the second mask in order to reduce a thickness of a portion of the photoresist on an area where a channel zone of a thin-film transistor is to be formed and remove a portion of the photoresist outside the area where the channel zone of the thin-film transistor is to be formed;

Step S15: applying a first etching operation to remove portions of the second metal layer and the semiconductor layer that are not covered by the photoresist;

Step S16: subjecting a remaining portion of the photoresist entirely to a thinning operation to remove the portion of the photoresist on the area where the channel zone of the thin-film transistor to be formed;

Step S17: applying a second etching operation to remove a portion of the second metal layer located on the area where the channel zone of the thin-film transistor is to be formed and also to remove a remaining portion of the photoresist, so as to form an active layer and a source electrode and a drain electrode that are respectively in contact engagement with two ends of the active layer to obtain a TFT layer; and Step S18: covering the TFT layer with a passivation layer.

Step S2 specifically comprises:

Step S21: coating the photoresist material comprising the crystallizable and precipitatable pigment on the passivation layer and subjecting the photoresist material to vacuum drying and pre-baking to form a photoresist film;

Step S22: subjecting the photoresist film to exposure, development, and post-baking in order to remove a portion of the photoresist film on an area where a pixel electrode is to be formed to obtain the photoresist layer; and Step S23: subjecting the passivation layer to etching to form the pixel electrode via.

Step S22 further comprises subjecting the photoresist film, after development, to ultraviolet (UV) irradiation.

The post-baking is conducted in Step S22 at a temperature of 230-260° C. for a time period of 20-40 minutes.

The crystallizable and precipitatable pigment comprises PR254 pigment.

The second mask comprises a gray tone mask or a half tone mask.

In Step S3, the pixel electrode via is formed to expose a portion of the drain electrode.

In Step S4, the pixel electrode is electrically connected, through the pixel electrode via, to the drain electrode.

The pixel electrode comprises a material of indium tin oxide (ITO).

The present invention also provides a TFT substrate manufacturing method, which comprises the following steps:

Step S1: providing a backing plate, forming a TFT layer on the backing plate through operations involving a first mask and a second mask, and covering the TFT layer with a passivation layer;

Step S2: forming a photoresist layer and a pixel electrode via through an operation involving a third mask, wherein the photoresist layer is made of a material comprising a crystallizable and precipitatable pigment; the photoresist layer is formed on the passivation layer; the photoresist layer comprises a pattern that corresponds to a pattern of a pixel electrode to be formed, and the photoresist layer has a surface on which a plurality of crystallization burrs are formed; and the pixel electrode via extends through the passivation layer to expose a portion of the TFT layer;

Step S3: forming a pixel electrode film on the passivation layer, the photoresist layer, and the pixel electrode via; and Step S4: applying a peeling agent to corrode the photoresist layer so as to peel off the photoresist layer and a portion of the pixel electrode film located on the photoresist layer to form a pixel electrode;

wherein the second mask comprises a gray tone mask or a half tone mask; and wherein the pixel electrode comprises a material of indium tin oxide (ITO).

The efficacy of the present invention is that the present invention provides a TFT substrate manufacturing method, which uses a photoresist material that contains crystallizable and precipitatable pigment to form a photoresist layer, so that a plurality of crystallization burrs can be formed on a surface of the photoresist layer, making it possible for a pixel electrode film not completely covering the surface of the photoresist layer and thus, allowing a peeling agent to pass through the crystallization burrs and penetrate into the photoresist layer to cause corrosion of the photoresist layer thereby peeling off the photoresist layer and a portion of the pixel electrode film located on the photoresist layer at the same time to form a pixel electrode, whereby, compared to the prior art, peeling can be conducted without adopting a special mask and involving special mask parameters and also requiring no plasma treatment so that the process of fabricating a TFT substrate can be simplified to enhance fabrication efficiency of the TFT substrate.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 12:
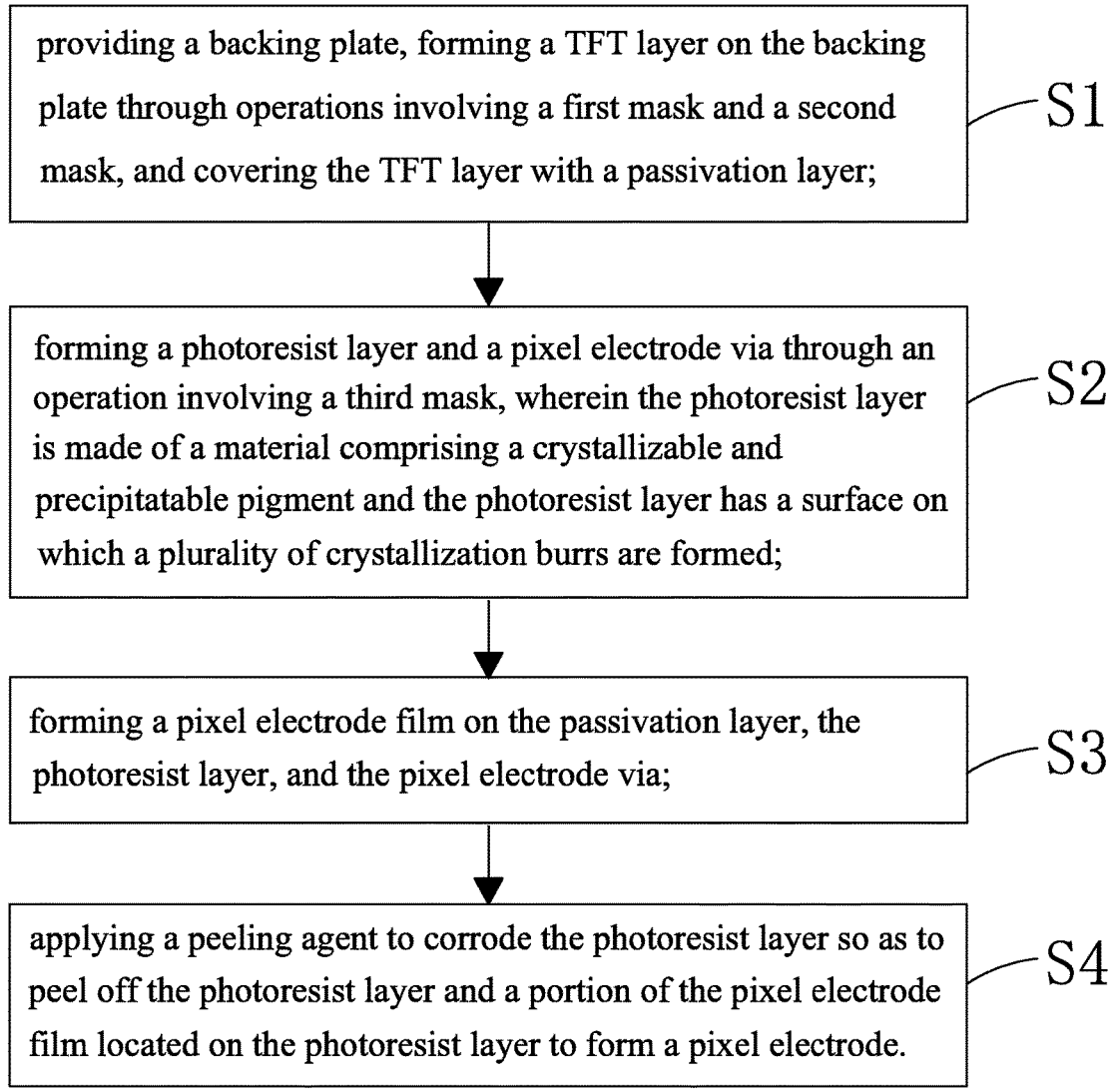
FIG. 12 is a flow chart illustrating the TFT substrate manufacturing method according to the present invention.

Referring to FIG. 12, the present invention provides a thin-film transistor (TFT) substrate manufacturing method, which comprises the following steps:

Step S1: providing a backing plate 1, forming a TFT layer 2 on the backing plate 1 through operations involving a first mask and a second mask, and covering the TFT layer 2v with a passivation layer 3.

Figure 1:
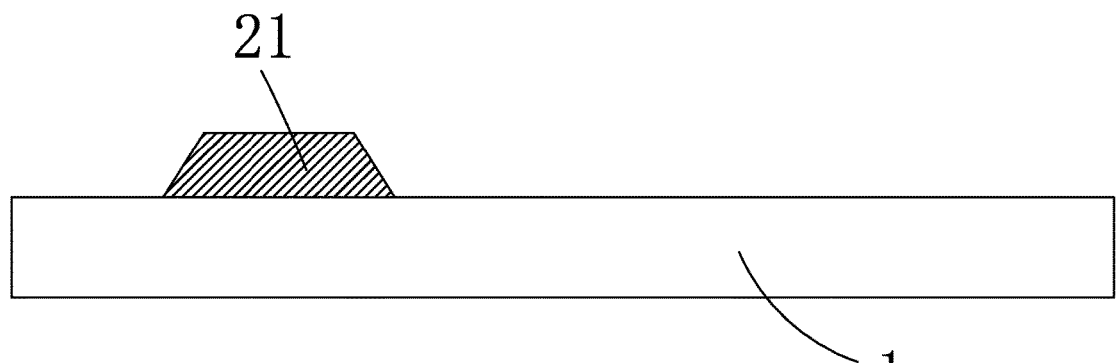
FIGS. 1-8 are schematic views illustrating Step S1 of a thin-film transistor (TFT) substrate manufacturing method according to the present invention.
Figure 2:
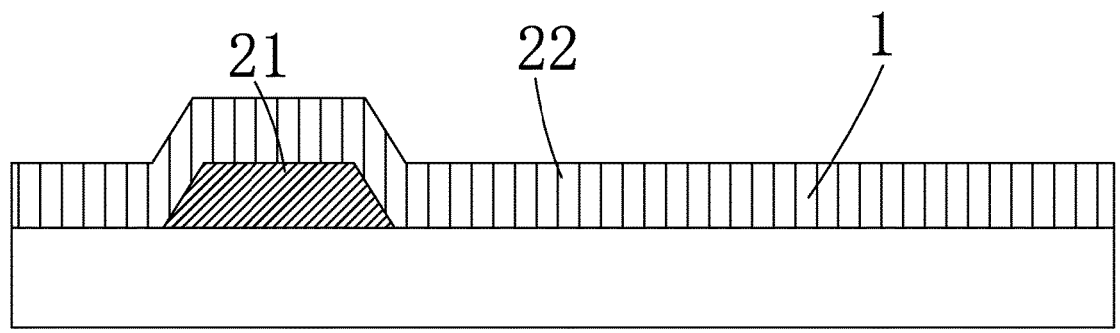
Figure 3:
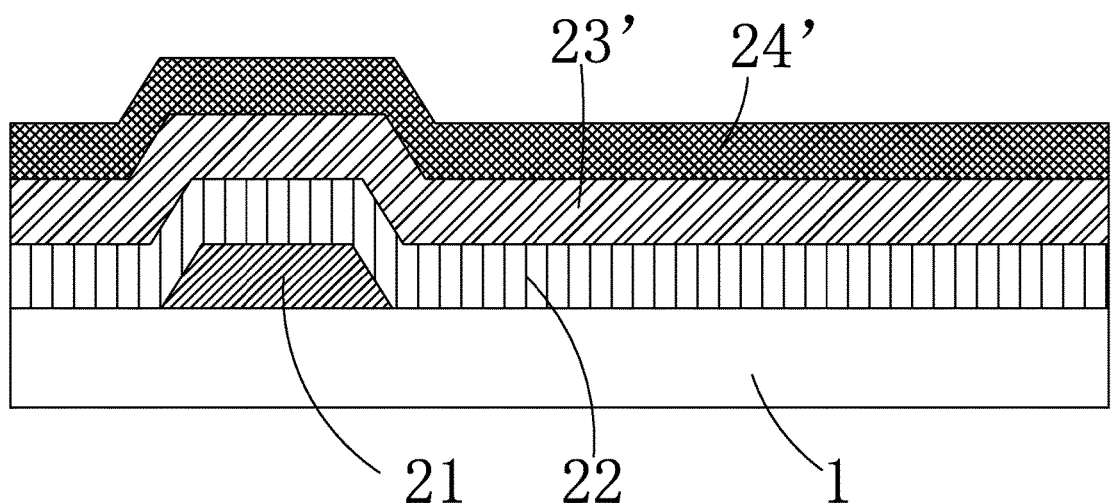
Figure 4:
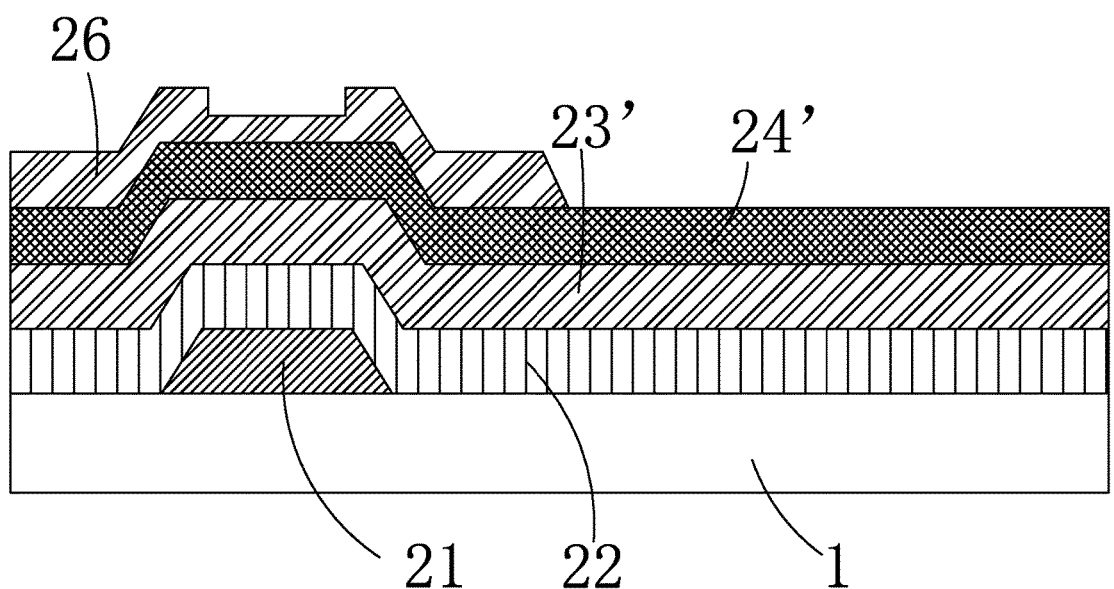
Figure 5:
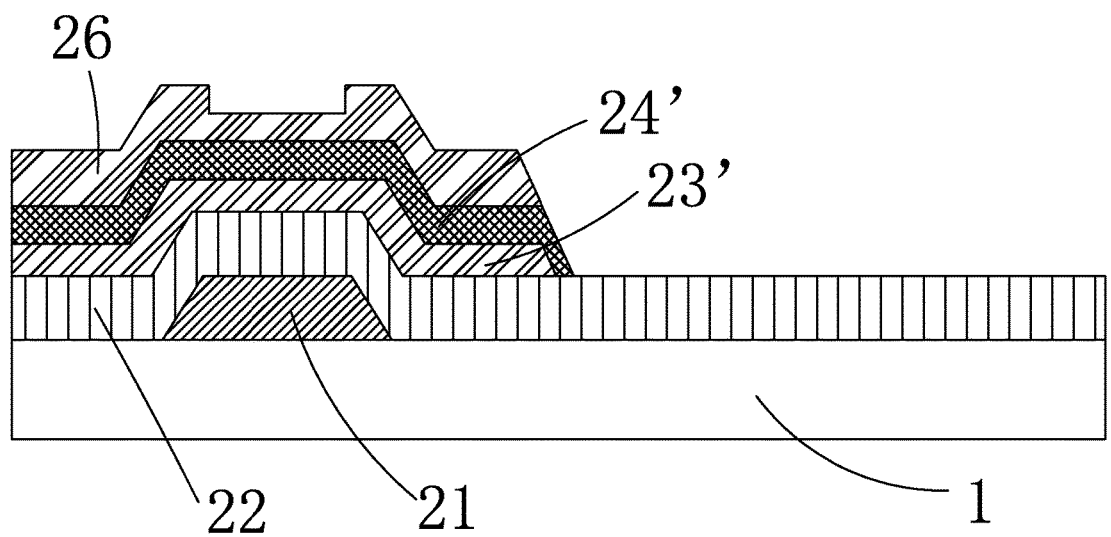
Figure 6:
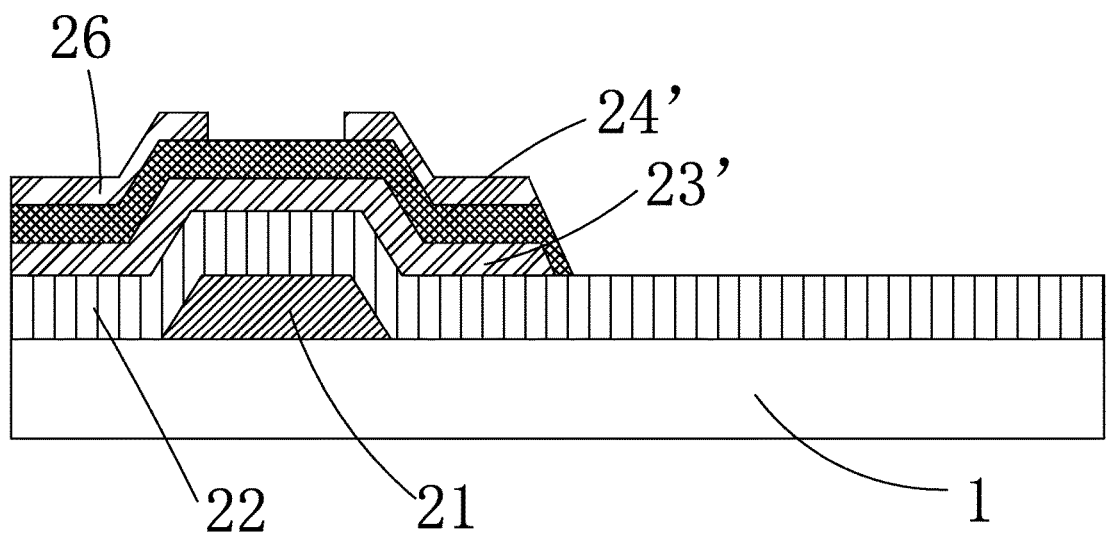
Figure 7:
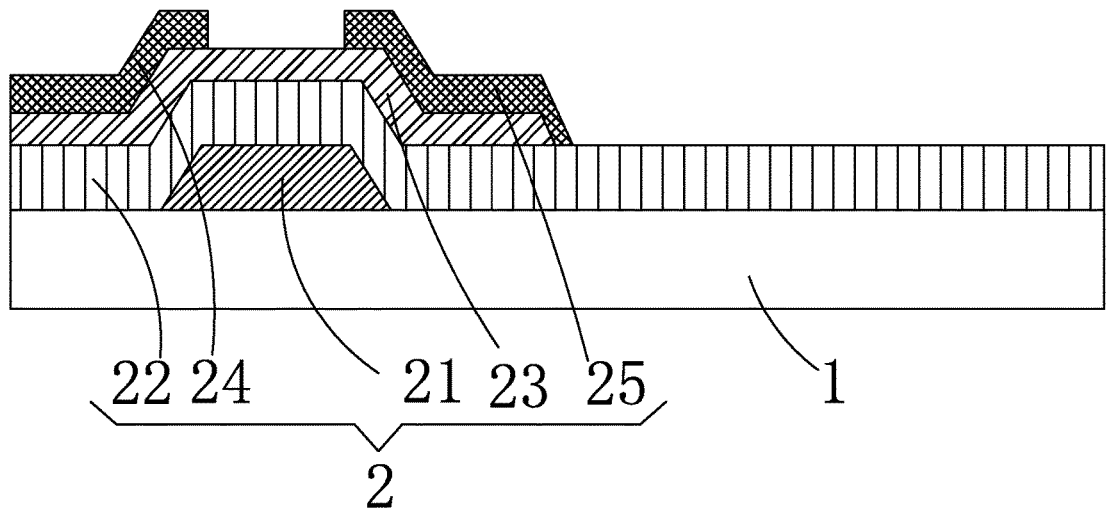
Figure 8:
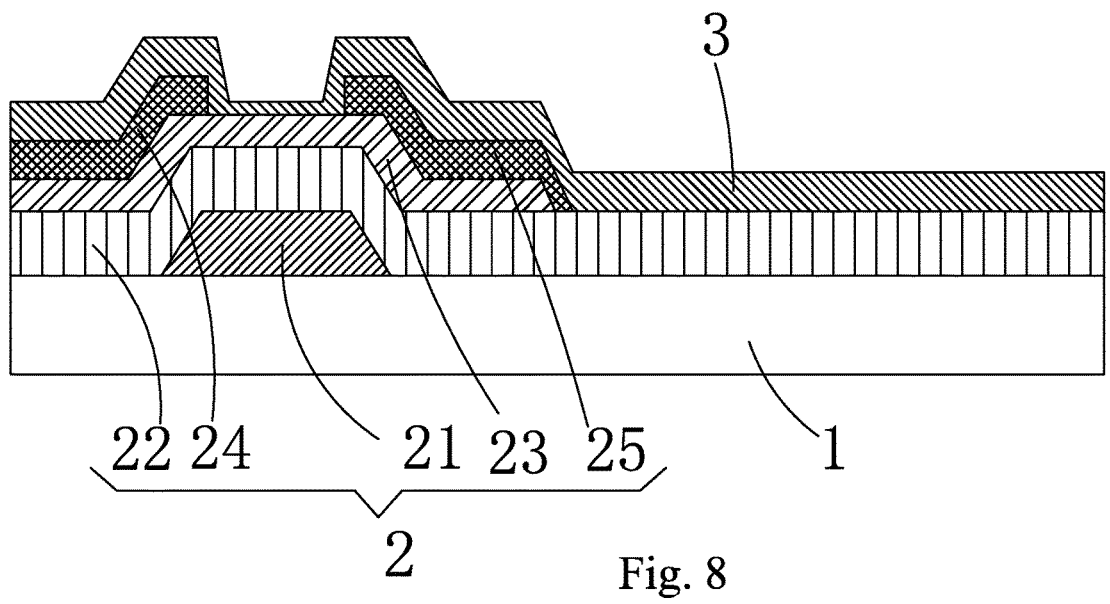

Specifically, referring to FIGS. 1-8, Step S1 specifically comprises:

Step S11: referring to FIG. 1, providing a backing plate 1, forming a first metal layer on the backing plate 1, and patterning the first metal layer with the first mask to form a gate electrode 21;

Step S12: referring to FIG. 2, covering the gate electrode 21 and the backing plate 1 with a gate insulation layer 22;

Step S13: referring to FIG. 3, forming a semiconductor layer 23' and a second metal layer 24', which are in a stacked arrangement, on the gate insulation layer 22;

Step S14: referring to FIG. 4, coating photoresist 26 on the second metal layer 24' and patterning the photoresist 26 with the second mask in order to reduce a thickness of a portion of the photoresist 26 on an area where a channel zone of a thin-film transistor is to be formed and remove a portion of the photoresist 26 outside the area where the channel zone of the thin-film transistor is to be formed;

Step S15: referring to FIG. 5, applying a first etching operation to remove portions of the second metal layer 24' and the semiconductor layer 23' that are not covered by the photoresist 26;

Step S16: referring to FIG. 6, subjecting a remaining portion of the photoresist 26 entirely to a thinning operation to remove the portion of the photoresist 26 on the area where the channel zone of the thin-film transistor to be formed;

Step S17: referring to FIG. 7, applying a second etching operation to remove a portion of the second metal layer 24' located on the area where the channel zone of the thin-film transistor is to be formed and also to remove a remaining portion of the photoresist 26, so as to form an active layer 23 and a source electrode 24 and a drain electrode 25 that are respectively in contact engagement with two ends of the active layer 23 to obtain a TFT layer 2; and Step S18: referring to FIG. 8, covering the TFT layer 2 with a passivation layer 3.

Preferably, the first metal layer and the second metal layer 24' are each made of a material comprising one of aluminum, molybdenum, and copper, or a combination of multiple ones thereof; the gate insulation layer 22 and the passivation layer 3 are each made of a material comprising one of silicon oxide (SiOx) and silicon nitride (SiNx) or a combination thereof; the backing plate 1 comprises a glass plate; and the active layer 23 comprises a semiconductor material that comprises amorphous silicon, polysilicon, or oxide semiconductors. The second mask can be a gray tone mask or a half tone mask.

Figure 9:
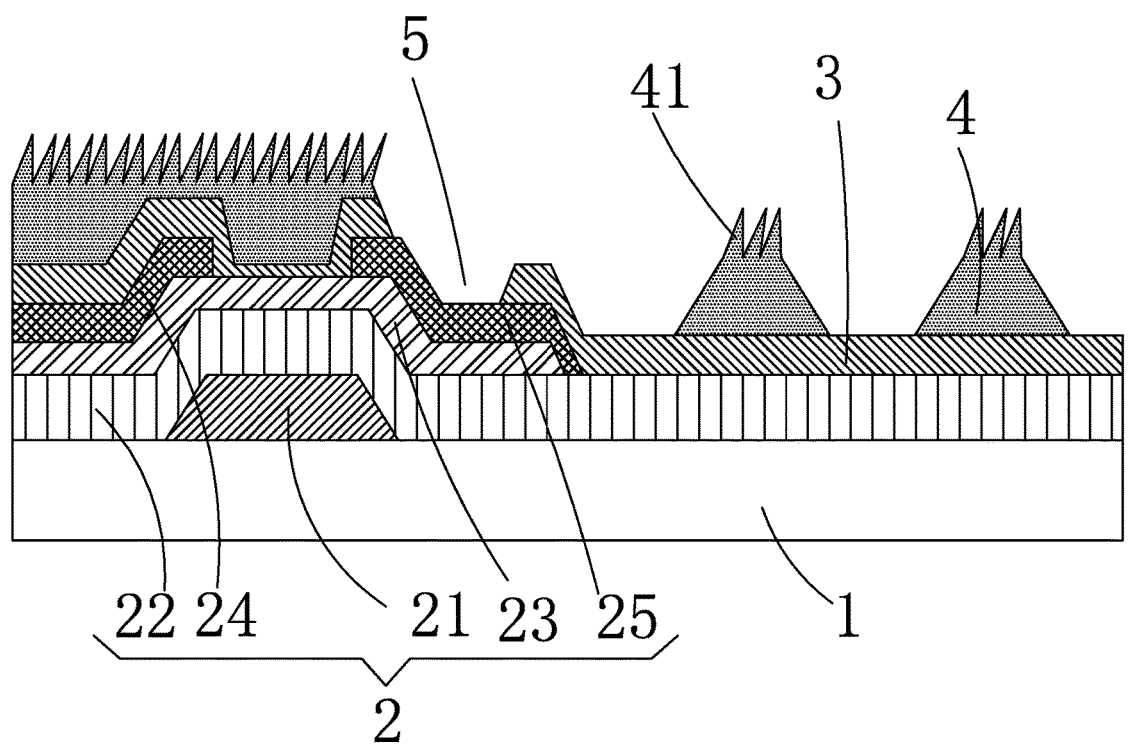
FIG. 9 is a schematic view illustrating Step S2 of the TFT substrate manufacturing method according to the present invention.

Step S2: referring to FIG. 9, forming a photoresist layer 4 and a pixel electrode via 5 through an operation involving a third mask;

The photoresist layer 4 is made of a material comprising a crystallizable and precipitatable pigment. The photoresist layer 4 is formed on the passivation layer 3. The photoresist layer 4 comprises a pattern that corresponds to a pattern of a pixel electrode to be formed, and the photoresist layer 4 has a surface on which a plurality of crystallization burrs 41 are formed. The pixel electrode via 5 extends through the passivation layer 3 to expose a portion of the TFT layer 2.

Specifically, Step S2 comprises:

Step S21: coating a photoresist material comprising crystallizable and precipitatable pigment on the passivation layer 3 and subjecting the photoresist material to vacuum drying and pre-baking to form a photoresist film;

Step S22: subjecting the photoresist film to exposure, development, and post-baking in order to remove a portion of the photoresist film on an area where a pixel electrode is to be formed to obtain a photoresist layer 4; and Step S23: subjecting the passivation layer 3 to etching to form a pixel electrode via 5.

Specifically, Step S22 further comprises subjecting the photoresist film, after development, to ultraviolet (UV) irradiation to make better precipitation of the crystallizable and precipitatable pigment through the UV irradiation so as to form a plurality of crystallization burrs 41. Preferably, the UV irradiation involves a light source that is deep ultraviolet (DUV) light or extreme ultraviolet (EUV) light. The post-baking is conducted in Step S22 at a temperature of 230-260° C. for a time period of 20-40 minutes.

It is noted here that adding crystallizable and precipitatable pigment in a commonly used photoresist material allows, after an operation involving a third mask, a plurality of crystallization burrs 41 to be naturally formed on a surface of the photoresist layer 4. Preferably, the crystallizable and precipitatable pigment comprises PR254 pigment.

Specifically, in Step S2, the pixel electrode via 5 is formed to expose a portion of the drain electrode 25.

Figure 10:
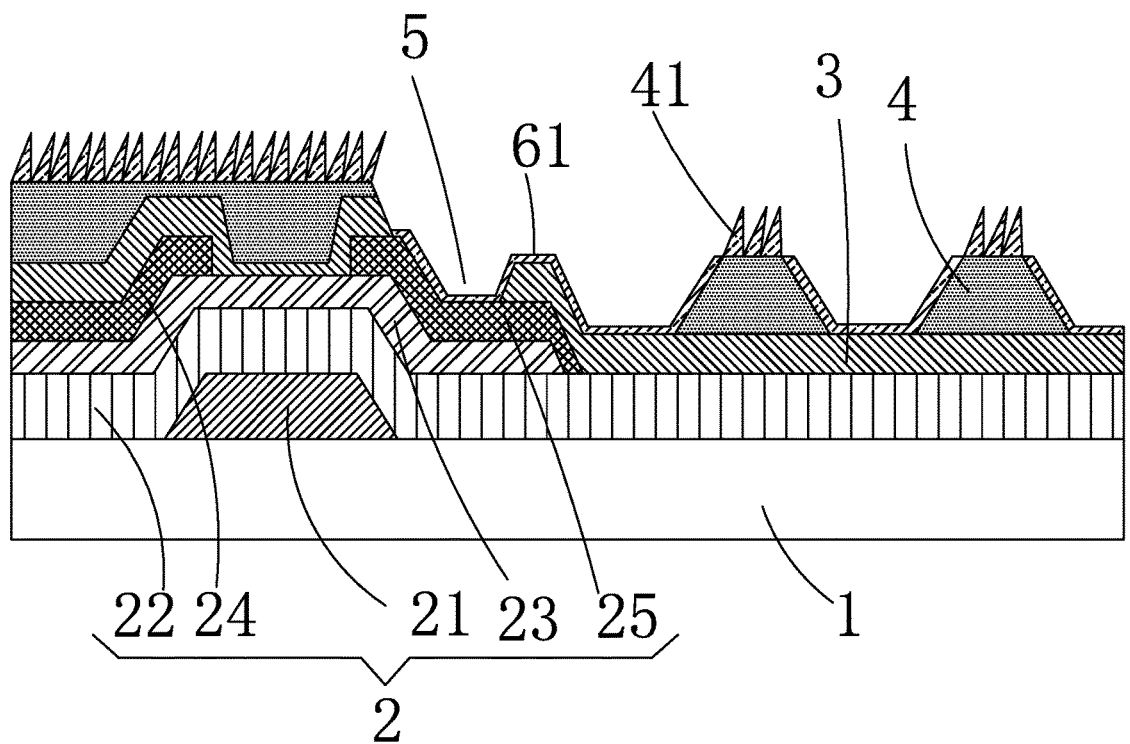
FIG. 10 is a schematic view illustrating Step S3 of the TFT substrate manufacturing method according to the present invention.

Step S3: referring to FIG. 10, forming a pixel electrode film 61 on the passivation layer 3, the photoresist layer 4, and the pixel electrode via 5.

It is noted here that since the surface of the photoresist layer 4 can be naturally formed with the plurality of crystallization burrs 41, the pixel electrode film 61 so formed cannot tightly cover a surface of the photoresist layer 4.

Figure 11:
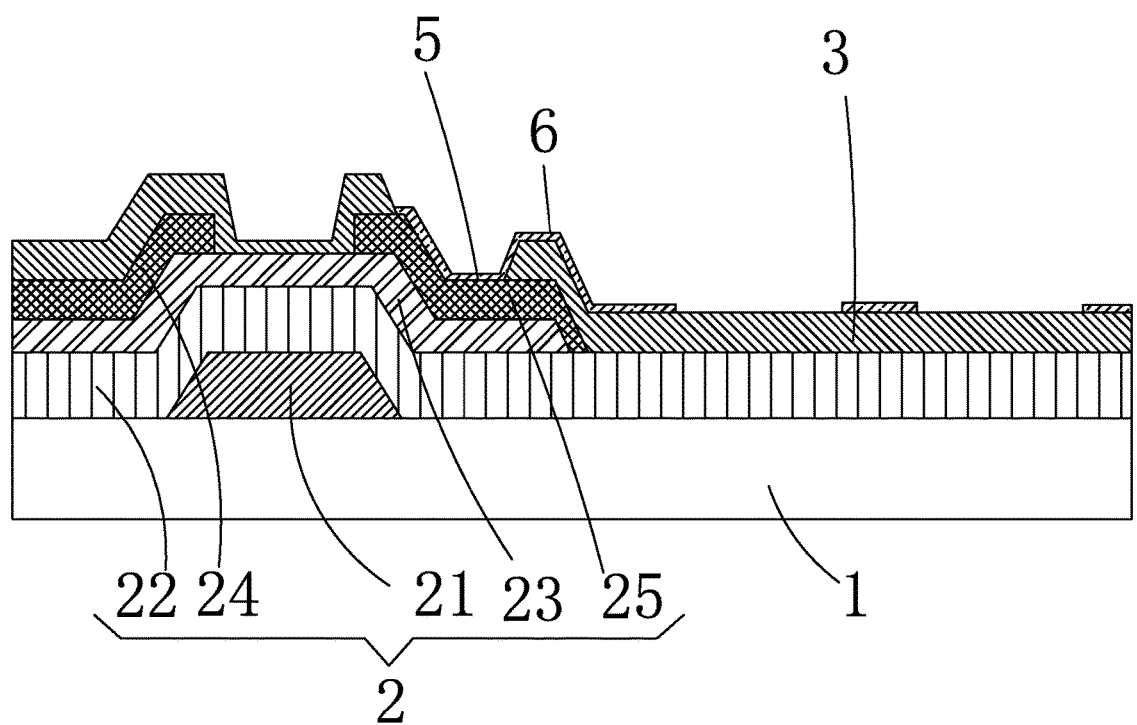
FIG. 11 is a schematic view illustrating Step S4 of the TFT substrate manufacturing method according to the present invention.

Step S4: referring to FIG. 11, applying a peeling agent liquid to corrode the photoresist layer 4 so as to peel off the photoresist layer 4 and a portion of the pixel electrode film 61 located on the photoresist layer 4 to form a pixel electrode 6.

Specifically, since the pixel electrode film 61 can be set to tightly cover the surface of the photoresist layer 4, the peeling agent is allowed to penetrate through the crystallization burrs 41 into the photoresist layer 4 to corrode the photoresist layer 4, in order to achieve peeling of the photoresist layer 4 and the portion of the pixel electrode film 61 located on the photoresist layer 4.

Specifically, in Step S4, the pixel electrode 6 is electrically connected, through the pixel electrode via 5, to the drain electrode 25. Preferably, the pixel electrode 6 is made of a material comprising indium tin oxide (ITO).

In summary, the present invention provides a TFT substrate manufacturing method, which uses a photoresist material that contains crystallizable and precipitatable pigment to form a photoresist layer, so that a plurality of crystallization burrs can be formed on a surface of the photoresist layer, making it possible for a pixel electrode film not completely covering the surface of the photoresist layer and thus, allowing a peeling agent to pass through the crystallization burrs and penetrate into the photoresist layer to cause corrosion of the photoresist layer thereby peeling off the photoresist layer and a portion of the pixel electrode film located on the photoresist layer at the same time to form a pixel electrode, whereby, compared to the prior art, peeling can be conducted without adopting a special mask and involving special mask parameters and also requiring no plasma treatment so that the process of fabricating a TFT substrate can be simplified to enhance fabrication efficiency of the TFT substrate.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A thin-film transistor (TFT) substrate manufacturing method, comprising the following steps:
   Step S1: providing a backing plate, forming a TFT layer on the backing plate through operations involving a first mask and a second mask, and covering the TFT layer with a passivation layer;
   Step S2: forming a photoresist layer and a pixel electrode via through an operation involving a third mask,
   wherein the photoresist layer is made of a material comprising a crystallizable and precipitatable pigment; the photoresist layer is formed on the passivation layer; the photoresist layer comprises a pattern that corresponds to a pattern of a pixel electrode to be formed, and the photoresist layer has a surface on which a plurality of crystallization burrs are formed; and the pixel electrode via extends through the passivation layer to expose a portion of the TFT layer;
   Step S3: forming a pixel electrode film on the passivation layer, the photoresist layer, and the pixel electrode via; and
   Step S4: applying a peeling agent to corrode the photoresist layer so as to peel off the photoresist layer and a portion of the pixel electrode film located on the photoresist layer to form a pixel electrode;
   wherein Step S2 specifically comprises:
   Step S21: coating the photoresist material comprising the crystallizable and precipitatable pigment on the passivation layer and subjecting the photoresist material to vacuum drying and pre-baking to form a photoresist film;
   Step S22: subjecting the photoresist film to exposure, development, and post-baking in order to remove a portion of the photoresist film on an area where a pixel electrode is to be formed to obtain the photoresist layer; and
   Step S23: subjecting the passivation layer to etching to form the pixel electrode via.

2. The TFT substrate manufacturing method as claimed in claim 1, wherein Step S1 specifically comprises:
   Step S11: providing the backing plate, forming a first metal layer on the backing plate, and patterning the first metal layer with the first mask to form a gate electrode;
   Step S12: covering the gate electrode and the backing plate with a gate insulation layer;
   Step S13: forming a semiconductor layer and a second metal layer, which are in a stacked arrangement, on the gate insulation layer;
   Step S14: coating photoresist on the second metal layer and patterning the photoresist with the second mask in order to reduce a thickness of a portion of the photoresist on an area where a channel zone of a thin-film transistor is to be formed and remove a portion of the photoresist outside the area where the channel zone of the thin-film transistor is to be formed;
   Step S15: applying a first etching operation to remove portions of the second metal layer and the semiconductor layer that are not covered by the photoresist;
   Step S16: subjecting a remaining portion of the photoresist entirely to a thinning operation to remove the portion of the photoresist on the area where the channel zone of the thin-film transistor to be formed;
   Step S17: applying a second etching operation to remove a portion of the second metal layer located on the area where the channel zone of the thin-film transistor is to be formed and also to remove a remaining portion of the photoresist, so as to form an active layer and a source electrode and a drain electrode that are respectively in contact engagement with two ends of the active layer to obtain the TFT layer; and
   Step S18: covering the TFT layer with a passivation layer.

3. The TFT substrate manufacturing method as claimed in claim 1, wherein Step S22 further comprises subjecting the photoresist film, after development, to ultraviolet (UV) irradiation.

4. The TFT substrate manufacturing method as claimed in claim 1, wherein the post-baking is conducted in Step S22 at a temperature of 230-260° C. for a time period of 20-40 minutes.

5. The TFT substrate manufacturing method as claimed in claim 1, wherein the crystallizable and precipitatable pigment comprises PR254 pigment.

6. The TFT substrate manufacturing method as claimed in claim 1, wherein the second mask comprises a gray tone mask or a half tone mask.

7. The TFT substrate manufacturing method as claimed in claim 2, wherein in Step S3, the pixel electrode via is formed to expose a portion of the drain electrode.

8. The TFT substrate manufacturing method as claimed in claim 7, wherein in Step S4, the pixel electrode is electrically connected, through the pixel electrode via, to the drain electrode.

9. The TFT substrate manufacturing method as claimed in claim 1, wherein the pixel electrode comprises a material of indium tin oxide (ITO).

10. A thin-film transistor (TFT) substrate manufacturing method, comprising the following steps:
    Step S1: providing a backing plate, forming a TFT layer on the backing plate through operations involving a first mask and a second mask, and covering the TFT layer with a passivation layer;
    Step S2: forming a photoresist layer and a pixel electrode via through an operation involving a third mask,
    wherein the photoresist layer is made of a material comprising a crystallizable and precipitatable pigment; the photoresist layer is formed on the passivation layer; the photoresist layer comprises a pattern that corresponds to a pattern of a pixel electrode to be formed, and the photoresist layer has a surface on which a plurality of crystallization burrs are formed; and the pixel electrode via extends through the passivation layer to expose a portion of the TFT layer;
    Step S3: forming a pixel electrode film on the passivation layer, the photoresist layer, and the pixel electrode via; and
    Step S4: applying a peeling agent to corrode the photoresist layer so as to peel off the photoresist layer and a portion of the pixel electrode film located on the photoresist layer to form a pixel electrode;
    wherein Step S2 specifically comprises:
    Step S21: coating the photoresist material comprising the crystallizable and precipitatable pigment on the passivation layer and subjecting the photoresist material to vacuum drying and pre-baking to form a photoresist film;
    Step S22: subjecting the photoresist film to exposure, development, and post-baking in order to remove a portion of the photoresist film on an area where a pixel electrode is to be formed to obtain the photoresist layer; and Step S23: subjecting the passivation layer to etching to form the pixel electrode via;

wherein the second mask comprises a gray tone mask or a half tone mask; and wherein the pixel electrode comprises a material of indium tin oxide (ITO).

11. The TFT substrate manufacturing method as claimed in claim 10, wherein Step S1 specifically comprises:

Step S11: providing the backing plate, forming a first metal layer on the backing plate, and patterning the first metal layer with the first mask to form a gate electrode;

Step S12: covering the gate electrode and the backing plate with a gate insulation layer;

Step S13: forming a semiconductor layer and a second metal layer, which are in a stacked arrangement, on the gate insulation layer;

Step S14: coating photoresist on the second metal layer and patterning the photoresist with the second mask in order to reduce a thickness of a portion of the photoresist on an area where a channel zone of a thin-film transistor is to be formed and remove a portion of the photoresist outside the area where the channel zone of the thin-film transistor is to be formed;

Step S15: applying a first etching operation to remove portions of the second metal layer and the semiconductor layer that are not covered by the photoresist;

Step S16: subjecting a remaining portion of the photoresist entirely to a thinning operation to remove the portion of the photoresist on the area where the channel zone of the thin-film transistor to be formed;

Step S17: applying a second etching operation to remove a portion of the second metal layer located on the area where the channel zone of the thin-film transistor is to be formed and also to remove a remaining portion of the photoresist, so as to form an active layer and a source electrode and a drain electrode that are respectively in contact engagement with two ends of the active layer to obtain the TFT layer; and Step S18: covering the TFT layer with a passivation layer.

12. The TFT substrate manufacturing method as claimed in claim 10, wherein Step S22 further comprises subjecting the photoresist film, after development, to ultraviolet (UV) irradiation.

13. The TFT substrate manufacturing method as claimed in claim 10, wherein the post-baking is conducted in Step S22 at a temperature of 230-260° C. for a time period of 20-40 minutes.

14. The TFT substrate manufacturing method as claimed in claim 10, wherein the crystallizable and precipitatable pigment comprises PR254 pigment.

15. The TFT substrate manufacturing method as claimed in claim 11, wherein in Step S3, the pixel electrode via is formed to expose a portion of the drain electrode.

16. The TFT substrate manufacturing method as claimed in claim 15, wherein in Step S4, the pixel electrode is electrically connected, through the pixel electrode via, to the drain electrode.

* * * * *